United States Patent [19]

Yatsuo et al.

[11] 3,783,350

[45] Jan. 1, 1974

[54] THYRISTOR DEVICE

[75] Inventors: Tsutomu Yatsuo; Takuzo Ogawa, both of Hitachi, Japan

[73] Assignee: Hitachi Ltd., Tokyo, Japan

[22] Filed: Aug. 10, 1971

[21] Appl. No.: 170,595

[30] Foreign Application Priority Data

Aug. 14, 1970 Japan .............................. 45/70789

[52] U.S. Cl. ........................ 317/235 R, 317/235 AB

[51] Int. Cl. .............................................. H01l 13/00

[58] Field of Search ...................................... 317/235

[56] References Cited

UNITED STATES PATENTS

| | | | |
|---|---|---|---|
| 3,577,046 | 5/1971 | Moyson | 317/235 |
| 3,697,833 | 10/1972 | Nakata et al. | 317/235 |
| 3,573,572 | 4/1971 | Cooper et al. | 317/235 |
| 3,586,928 | 6/1971 | Bergman | 317/235 |
| 3,611,072 | 10/1971 | Hamilton | 317/235 |
| 3,586,927 | 6/1971 | Roach | 317/235 |

*Primary Examiner*—John W. Huckert
*Assistant Examiner*—E. Wojciechowicz
*Attorney*—Craig, Antonelli & Hill

[57] ABSTRACT

A thyristor device comprising a first thyristor and a second thyristor of smaller capacity which is turned on in response to a gate current smaller than that for the first thyristor. In the thyristor device, majority carriers accumulating in excess in an intermediate layer of the second thyristor due to the turn-on of the second thyristor are transferred into an intermediate layer of the first thyristor for turning on the latter.

15 Claims, 7 Drawing Figures

INVENTORS

TSUTOMU YATSUO, TAKUZO OGAWA

BY Craig, Antonelli & Hill

ATTORNEYS

INVENTORS

TSUTOMU YATSUO, TAKUZO OGAWA

BY Craig, Antonelli & Hill

ATTORNEYS

INVENTORS

TSUTOMU YATSUO, TAKUZO OGAWA

BY Craig, Antonelli & Hill

ATTORNEYS

INVENTORS

TSUTOMU YATSUO, TAKUZO OGAWA

BY Craig, Antonelli & Hill
ATTORNEYS

THYRISTOR DEVICE

BACKGROUND OF THE INVENTION

1. Field of the Invention

This invention relates to a thyristor device.

Description of the Prior Art

Thyristors of the type turned on by gate current applied to the gate thereof comprise generally a four-layer semiconductor wafer of PNPN structure, a pair of main electrodes in low ohmic contact with the P-type and N-type end layers of the semiconductor wafer, and a control electrode or gate for turning on the device. When, in such a thyristor, a forward voltage is applied across the two main electrodes and then a gate voltage of pulse waveform is applied across the gate and the main electrode, current starts to flow across the two main electrodes of the thyristor which has been blocked in the forward direction. The thyristor is said to be turned on when such a shift from the forward blocking state to the conducting state takes place.

The turn-on process of the thyristor of the type which is turned on in response to the application of gate current to the gate is such that a region of small area in the vicinity of the gate electrode is initially turned on in response to the application of the gate current and the entire region is gradually turned on with the lapse of time. When, therefore, the inrush current slope di/dt during the turn-on of the thyristor is undesirably steep, the current density becomes excessively large in the conducting portion of limited area in the vicinity of the gate and the temperature in that portion rises beyond an allowable limit resulting in thermal breakdown of the thyristor. In order that the thyristor can withstand current which increases with a steep inrush current slope di/dt so that it thermal breakdown may be prevented from undesirable thermal breakdown, it is necessary to enlarge the area which conducts immediately in the early stage of turn-on in response to the application of the gate current. This can be attained by increasing the length of the portion of the gate opposite to one of the end layers. For example, the thyristor can withstand current increasing with a steep inrush current slope *di/dt* by shaping the gate in the form of a ring so that initial conduction takes place over the entire periphery of one of the end layers. However, the increase in the length of the gate opposite to one of the end layers is limited in that a correspondingly large gate current is required for turning on the thyristor.

In an attempt to obtain the widest possible initially conducting area which is turned on in response to a small gate current, various gate triggering methods have heretofore been proposed. One of such methods is disclosed in West German Pat. No. 1,489,931 according to which one of the end layers connected to one of the main electrodes has its thickness reduced at a portion between the main electrode and the gate so that this portion of the end layer has an increased lateral resistance. According to this arrangement, a portion parallel to the end layer portion having an increased lateral resistance is turned on simultaneously by the turn-on current traversing the portion turned on by the small gate current. Thus, the thyristor can withstand current increasing with a steep inrush current slope *di/dt* by increasing the length of this parallel portion. However, as will be described below, this thyristor is limited in that it will be prematurely turned on before application of the gate current when the temperature rises beyond an allowable limit and the voltage build-up rate *dV/dt* is increased. More precisely, in this type of thyristor, the so-called shorted emitter structure, in which the N-type end layer and the adjacent intermediate layer are shorted by the main electrode, are widely employed in order to eliminate adverse effects due to temperature rise and the voltage build-up rate. In the thyristor, the portion of the N-type end layer shorted to the adjacent intermediate layer by the main electrode must have a uniform density over the entire N-type end layer. However, when a portion having a reduced thickness and an increased lateral resistance, that is, a portion which is not in contact with the main electrode is provided in the end layer in order to improve the turn-on characteristic as above described, the shorted emitter structure cannot be applied to this portion, and therefore, the adverse effect due to the temperature rise and voltage build-up rate cannot be eliminated. While the turn-on characteristic can be improved when the portion having the increased lateral resistance has a largest possible length along the outer periphery of the end layer, the advantage owing to the shorted emitter structure, hence the advantage of elimination of the adverse effect due to the temperature rise and voltage build-up rate is reduced correspondingly. Therefore, the provision of a portion having a large lateral resistance in the end layer and enlargement of the area of this portion for improving the turn-on characteristic results in the disadvantage that the thyristor is adversely affected by the temperature rise and voltage build-up rate, and this method cannot be applied to thyristors operating with a large current, high voltage or high frequency.

SUMMARY OF THE INVENTION

It is an object of the present invention to provide a thyristor device which is turned on in response to the application of a small gate current and can withstand current increasing with a steep inrush current slope *di/dt* during the turn-on stage.

Another object of the present invention is to provide a thyristor device whose turn-on characteristic is not affectedly the temperature rise and voltage buildup rate *dV/dt*.

A further object of the present invention is to provide a thyristor device which shows an excellent turn-on characteristic and can operate with a large current.

A still further object of the present invention is to provide a thristor device which shows an excellent turn-on characteristic and can operate with a high voltage.

Another object of the present invention is to provide a thyristor device which shows an excellent turn-on characteristic and can operate with a high frequency.

DESCRIPTION OF THE PREFERRED EMBODIMENTS

Figure 1:
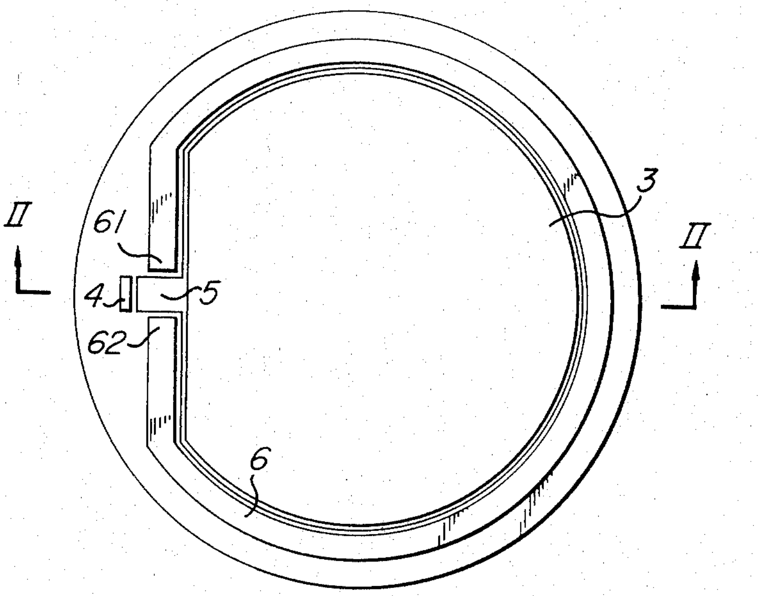
FIG. 1 is a schematic plan view of an embodiment of the present invention.

In a thyristor which is turned on in response to a gate current the conducting region spreads gradually from the portion near the gate toward the entire area as described previously. The emitter junction between the end layer in the vicinity of the gate which is initially rendered conducting and the adjacent intermediate layer is forward biased by the gate voltage thereby starting injection of electrons into the adjacent intermediate layer. However, it is considered that in a region remote from the gate, the gate current does not act directly as a control current, but rather this region is rendered conducting by the lateral base current corresponding to the gate current supplied from the region which is intermediate between this remote region and the gate and has been conducting already.

According to a simple one dimensional thyristor model, the following equation holds between the gate current $I_G$ required for turning on the thyristor and the current $I_A$ flowing across the main electrodes:

$$I_G = I_A \cdot i - \alpha_{12} - \alpha_{32}/\alpha_{12}$$

where $\alpha_{12}$ and $\alpha_{32}$ are the current amplification factors of the two transistor portions of PNP and NPN structure respectively constituting the thyristor. The current amplification factors $\alpha_{12}$ and $\alpha_{32}$ increase generally with the increase in the current $I_A$ flowing through the thyristor. Therefore, the gate current $I_G$ increases first with the increase in the current $I_A$ and starts to gradually decrease after attaining a peak. The gate current $I_G$ is decreased to zero when the thyristor is turned on at which time $\alpha_{12} + \alpha_{32} = 1$, and thereafter it is inverted to have a negative value. When, therefore, a small region in the vicinity of the gate has initially been rendered conducting, gate current of negative value is only is required. It considered that this excess current flows transversely across the intermediate layer on the side of the gate electrode toward to the adjacent region and acts on this region in a manner similar to the gate current thereby turning on this region. The thyristor is supported to be turned on by the gate current due to the above manner of spread of the conducting region. From another point of view, the above turn-on process may be explained as described below. Many holes are injected from the opposite end layer to accumulate in excess in the intermediate layer including the conducting region on the side of the gate. These excess holes act to increase the potential of that portion with respect to the adjacent end layer so as to further accelerate the injection of electrons from the adjacent end layer. At the same time, the excess holes move transversely across the intermediate layer on the side of the gate and act to increase the potential of the other region in the same intermediate layer so that the injection of electrons from the emitter junction is started to turn on this region.

While the above description has referred to the process of spread of the conducting region in the thyrsitor in which the gate is disposed on the P-type intermediate layer, this applies also to a thyristor of NPNP structure in which the gate is disposed on the N-type intermediate layer and electrons are majority carriers.

The present invention is based on such a turn-on process and is featured by the fact that the excess base current produced in an already conducting region, that is, the majority carriers which may be holes or electrons accumulating in excess in an intermediate layer on the side of the gate and traversing this layer are transferred by means of an external conductor to an emitter junction remote from the conducting region so as to further enlarge the region which is turned on concurrently.

Figure 2:
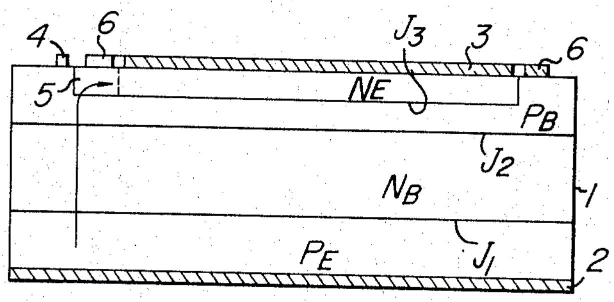
FIG. 2 is a sectional view taken on the line I — I in FIG. 1.

Referring now to FIGS. 1 and 2 of the drawings, a thyristor device embodying the present invention includes a semiconductor wafer 1 of four-layer structure which consists of layers $P_E$, $N_B$, $P_B$ and $N_E$ of alternately different conductivity types. The layer $N_B$ is an N-type base layer. The layers $P_E$ and $P_B$ are a P-type emitter layer and a P-type base layer formed on opposite sides of the N-type base layer $N_B$ for forming a first and a second P-N junctions $J_1$ and $J_2$ between them and the N-type base layer $N_B$ respectively. The layer $N_E$ is an N-type emitter layer which is embedded in the P-type base layer $P_B$ with its surface exposed to the outside and forms a third P-N junction (emitter junction) $J_3$ between it and the P-type base layer $P_B$. An anode 2 is in low ohmic contact with the surface of the P-type emitter layer $P_E$, and a cathode 3 is in low ohmic contact with the surface of the N-type emitter layer $N_E$. A gate or triggering means 4 is in low ohmic contact with the surface of the P-type base layer $P_B$. A projecting region 5 of narrow width projects from a portion opposite to the gate 4 of the N-type emitter layer $N_E$ toward the gate 4. A substantially annular metal strip 6 is in low ohmic contact with the upper surface of the P-type base layer $P_B$ and is disposed opposite to the N-type emitter layer $N_E$ with a predetermined space maintained between its inner periphery and the outer periphery of the N-type emitter layer $N_E$. The annular metal strip 6 has generally straight portions terminating in open ends 61 and 62 disposed opposite to each other with the projecting region 5 interposed therebetween so that it acts as a triggering means for the thyristor beneath the N-type emitter layer $N_E$.

In operation, a voltage is first applied across the anode 2 and the cathode 3 so that the anode 2 is positive with respect to the cathode 3. The first and third P-N junctions $J_1$ and $J_3$ are thereby forward biased, but the second P-N junction $J_2$ is reverse biased and a depletion layer is formed in the vicinity of the junction $J_2$ to maintain the thyristor device in the blocked state. Then, when a gate voltage is applied across the cathode 3 and the gate 4 so that the gate 4 is positive with respect to the cathode 3, gate current flows through the channel leading from the gate 4 to the cathode 3 through the P-type base layer $P_B$ and the projecting region 5 of the N-type emitter layer $N_E$, with the result that the portion of the third P-N junction $J_3$ corresponding to the projecting region 5 is forward biased and turn-on takes place in the four-layer region beneath the projection region 5 according to the conventional thyristor turn-on process. The turn-on current flows in a direction shown by the arrow. This current flows transversely across the projecting region 5 of narrow width of the N-type emitter layer $N_E$ toward the cathode 3. Due to the flow of the turn-on current, holes which are majority carriers accumulate in excess in the portion of the P-type base layer $P_B$ corresponding to the projecting region 5 and flow into the annular metal strip 6 provided on the surface of the P-type base layer $P_B$. That is, excess base current produced in the turned-on projecting region 5 as above described flows into the annular metal strip 6 to be transferred to the peripheral edge portion of the N-type emitter layer $N_E$ opposite to the annular metal strip 6. In this case, the voltage drop across the projecting region 5, hence the lateral resistance of the projecting region 5 determines the magnitude of and the rate of increase in the base current flowing into the annular metal strip 6. The base current thus conducted to the peripheral edge portion of the N-type emitter layer $N_E$ acts as a sort of gate current for the N-type emitter layer $N_E$ and turn-on takes place in the entire periphery of the N-type emitter layer $N_E$.

It will be understood from the above description that, in the thyristor device according to the present invention, an auxiliary thyristor portion formed by the projecting region 5 of narrow width is initially turned on in response to the application of gate current, and the base current produced by the transfer of holes accumulating in excess in the P-type base layer $P_B$ due to the turn-on of the auxiliary thyristor portion is forcibly supplied to the peripheral edge portion of the N-type emitter layer $N_E$ through the annular metal strip 6 provided on the P-type base layer $P_B$ so that this current acts as a gate current for the N-type emitter layer $N_E$ to turn on same. Therefore, the gate current supplied to the gate 4 may have a small value which is enough to turn on only the projecting region 5 of very small area, and this value is about 1/5 to 1/10 of the gate current required for turning on conventional thyristors provided with an annular gate. Further, according to the present invention, turn-on can take place concurrently at the entire periphery of the N-type emitter layer $N_E$. This is advantageous in that the conducting region spreads at a fast rate, and therefore, the device can withstand current increasing with a steep inrush current slope *di/dt*. According to the present invention, furthermore, the portion of the emitter region which is not provided with an electrode (conductor) is limited to a very small area corresponding to the projecting region 5 of very small area projecting from the N-type emitter layer $N_E$ toward the gate 4. This is advantageous in that the provision of the projecting region 5 does not reduce the merits of the shorted emitter structure, and therefore, turn-on can be reliably attained without being affected by temperature rise and the voltage build-up rate *dV/dt*. The conventional thyristor in which the thickness of a portion of the end layer is reduced to provide a large lateral resistance thereat is limited in that the end layer which may be formed by diffusion or alloying must be externally processed, for example, by etching resulting in the need for an additional step in manufacture. In contrast, the resistance of the projecting region 5 in the thyristor device according to the present invention is freely adjustable by varying the width thereof. This is advantageous in that the shape of the mask for forming the N-type emitter layer $N_E$ including the projecting region 5 by diffusion may be suitably selected to adjust the resistance of the projecting region 5, and therefore, the device can be easily manufactured.

Figure 3:
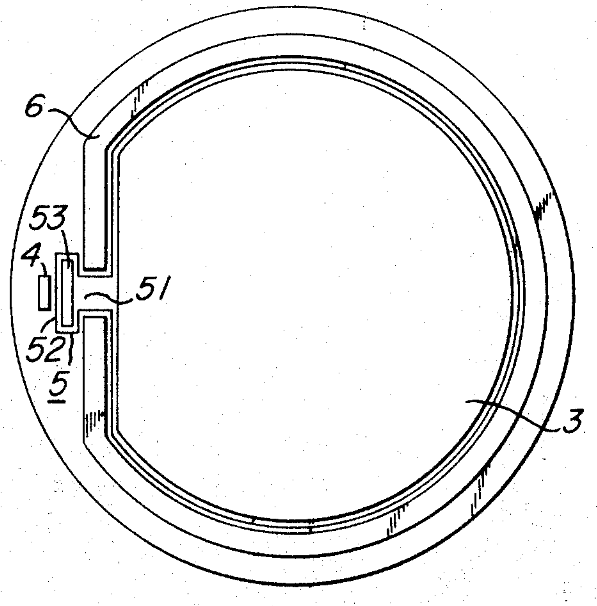
FIGS. 3, 4, 5 and 6 are schematic plan views of other embodiments of the present invention.

FIG. 3 shows another embodiment of the present invention, and like reference numerals are used therein to denote like parts appearing in FIGS. 1 and 2. The thyristor device shown in FIG. 3 is featured by the fact that a projecting region 5 of an N-type emitter layer $N_E$ consists of a neck portion 51 lying opposite to open ends 61 and 62 of a substantially annular metal strip 6, and a head portion 52 extending from the neck portion 51 in opposite directions and at right angles with respect to the neck portion 51 beyond the ends 61 and 62 of the annular metal strip 6 toward a gate 4 so that it has a width larger than that of the neck portion 51. This arrangement ensures reliable operation of the device.

More precisely, extension of the head portion 52 along the straight portions of the annular metal strip 6 eliminates reliably such trouble as that where the gate current from the gate 4 flows into the annular metal strip 6 resulting in the need for an excessively large gate current for turning on the projection region 5. This arrangement is further advantageous in that holes accumulating in excess due to the turn-on of the region beneath the projecting region 5 can easily flow into the annular metal strip 6 and the merit of reduction in the gate current described with reference to FIGS. 1 and 2 can be further improved.

A conductive layer 53 of a shape substantially similar to the shape of the head portion 52 is in low ohmic contact with the surface of the head portion 52 of the projecting region 5. This conductive layer 53 acts to stabilize the potential at the surface of the head portion 52 when the region beneath the projecting region 5 is turned on so that excess holes can flow into the annular metal strip 6 at an increased area and the N-type emitter layer $N_E$ can be turned on quickly at its entire periphery. The conductive layer 53 acts also to eliminate the adverse effect due to the voltage build-up rate *dV/dt* and temperature rise owing to the presence of the head portion 52.

Figure 4:
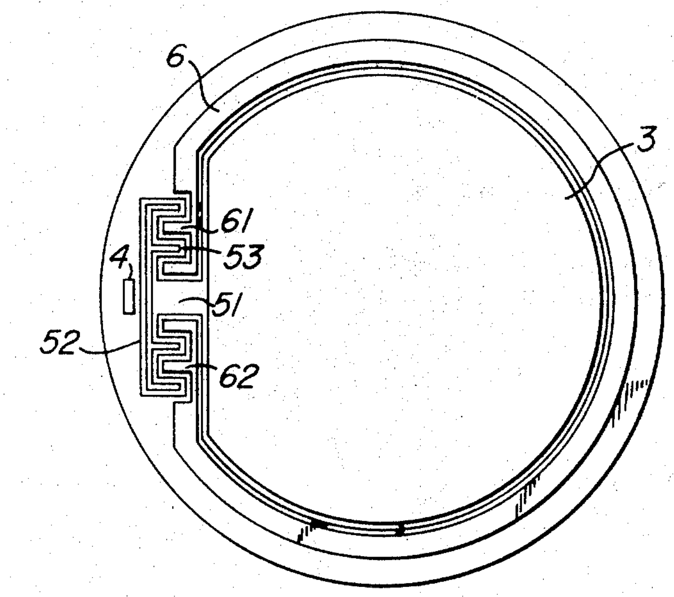

FIG. 4 shows a further embodiment of the present invention and like reference numerals are used therein to denote like parts appearing in FIG. 3. The thyristor device shown in FIG. 4 is featured by the fact that open ends 61 and 62 of a substantially annular metal strip 6 and a head portion 52 extending from a neck portion 51 of a projecting region 5 are shaped in the form of a comb at portions opposite to each other, and the teeth formed on the open ends 61 and 62 of the annular metal strip 6 extend into the space between the teeth formed on the head portion 52 as shown so that holes accumulating in excess can flow into the annular metal strip 6 more efficiently. A conductive layer 53 of a shape substantially similar to the shape of the head portion 52 is provided on the surface of the head portion 52 for the same reasons as those described with reference to FIG. 3.

Figure 5:
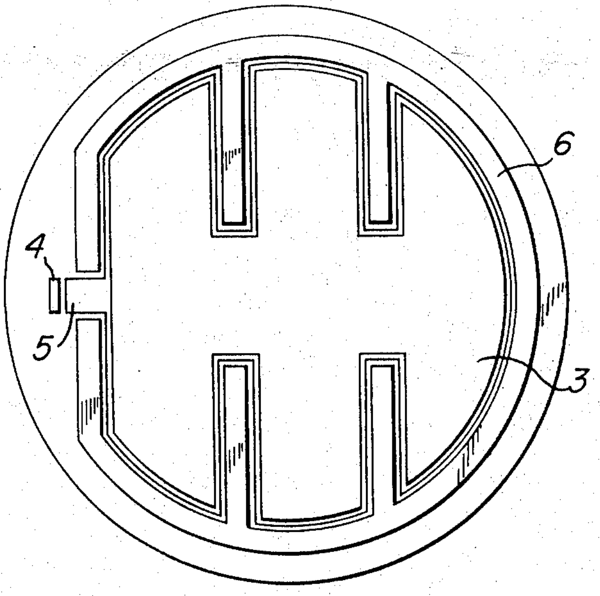

FIG. 5 shows a still further embodiment of the present invention and like reference numerals are used therein to denote like parts appearing in FIGS. 1 and 2. The thyristor device shown in FIG. 5 is featured by the fact that a substantially annular metal strip 6 is provided with a plurality of comb-like teeth extending inwardly to overlie comb-like recesses of corresponding shape formed in the peripheral portions of an N-type emitter layer $N_E$ so that the region of the N-type emitter layer $N_E$ initially turned on can be widened compared with the thyristor devices shown in FIGS. 1 to 4. This arrangement is advantageous in that the peripheral length of the N-type emitter layer $N_E$ opposite to the annular metal strip 6 can be greatly increased so that the region of the N-type emitter layer $N_E$ initially turned on can be widened. The thyristor device of this construction is usable in a high frequency circuit. In this case too, the projecting region 5 may consist of a head portion and a neck portion as shown in FIG. 3 or the head portion of the projecting region 5 and the portions of the annular metal strip 6 opposite to the projecting region 5 may be shaped in the form of a comb as shown in FIG. 4 so as to reduce the gate current.

Figure 6:
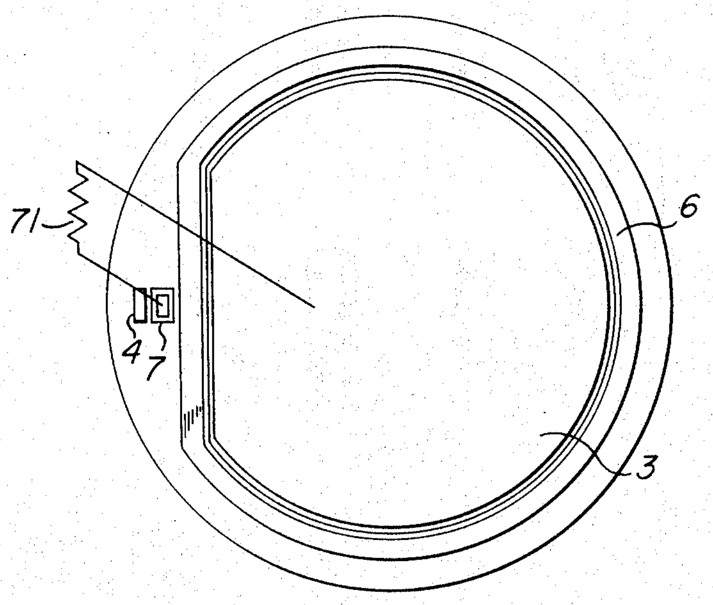

FIG. 6 shows another emobdiment of the present invention and like reference numerals are used therein to denote like parts appearing in FIGS. 1 and 2. The thyristor device shown in FIG. 6 is featured by the fact that an N-type emitter layer $N_E$ is completely surrounded by a substantially annular metal strip 6, and an additional N-type layer 7 of small area is formed between the N-type emitter layer $N_E$ and a gate 4 at the outside of the annular metal strip 6 and is isolated from the N-type emitter layer $N_E$ by a portion of a P-type base layer $P_B$ so as to facilitate the flow of holes accumulating in excess in the P-type base layer $P_B$ into the annular metal strip 6, the additional N-type layer 7 being connected to a cathode 3 by an impedance element 71. The impedance of the impedance element 71 is selected to be substantially equal to the lateral resistance (impedance) of the projecting region 5 for the current flowing from the gate 4 toward the cathode 3 in FIGS. 1 to 5. The combination of the additional N-type layer 7 and the impedance element 71 attains the same functional effect as that attained by the projecting region 5 shown in FIGS. 1 to 5. More precisely, the additional N-type layer 7 is turned on in response to the application of gate current, and the turn-on current flows from the additional N-type layer 7 to the cathode 3 through the impedance element 71. A voltage drop occurs across the impedance element 71, and due to this voltage drop, holes accumulating in excess in the P-type base layer $P_B$ are transferred toward the N-type emitter layer $N_E$ thereby producing base current. This base current flows into the entire periphery of the N-type emitter layer $N_E$ through the annular metal strip 6 thereby turning on the N-type emitter layer $N_E$ at its entire periphery as in the case of the thyristor devices shown in FIGS. 1 to 5. Such an arrangement is advantageous in that base current can be reliably conducted to the annular metal strip 6 and the N-type emitter layer $N_E$ can be quickly turned on at its entire periphery due to the fact that the annular metal strip 6 has a portion thereof situated between the additional N-type layer 7 and the N-type emitter layer $N_E$. The potential difference between the additional N-type layer 7 and the N-type emitter layer $N_E$ can be further increased when an inductive impedance element such as an inductance element or diode is used as the impedance element 71. In this embodiment too, the additional N-type layer 7 may be extended along the stright portion of the generally annular metal strip 6, or both the additional N-type layer 7 and the straight portion of the generally annular metal strip 6 may be shaped in the form of a comb so that their teeth may mesh with each other, or the generally annular metal strip 6 may be provided with a plurality of comb-like teeth extending inwards to overlie comb-like recesses of corresponding shape formed in the peripheral portions of the N-type emitter layer $N_E$ as shown in FIG. 4.

While the foregoing description given with reference to FIGS. 1 to 6 has referred to the thyristor structure in which the substantially annular metal strip 6 is disposed around the cathode 3 overlying the N-type emitter layer $N_E$ and the gate 4 is disposed on the P-type base layer $P_B$ for the purpose of supplying base current to the entire periphery of the N-type emitter layer $N_E$, the present invention is in no way limited to such a specific structure. For example, the annular metal strip 6 need not be provided when it is unnecessary to cause the N-type emitter layer $N_E$ to turn on at its entire periphery depending on the service, and the gate 4 may be provided on the projecting region 5 or additional N-type layer 7 in lieu of the described position. In these cases too, the present invention exhibits the desired technical merits.

Figure 7:
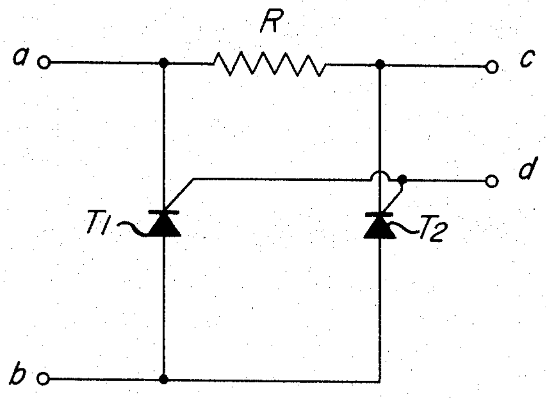
FIG. 7 is an equivalent circuit diagram of the thyristor device according to the present invention.

FIG. 7 is an equivalent circuit diagram of the thyristor device according to the present invention. The equivalent circuit shown in FIG. 7 includes a first thyristor $T_1$ of large capacity and a second thyristor $T_2$ of small capacity. The first thyristor $T_1$ of large capacity is connected directly across main terminals *a* and *b*, while the second thyristor $T_2$ of small capacity is connected across the main terminals *a* and *b* through a resistance R in parallel with the first thyristor $T_1$. The second thyristor $T_2$ of small capacity has its cathode and gate connected directly to auxiliary terminals *c* and *d* respectively, while the first thyristor $T_1$ of large capacity has its gate connected directly to the auxiliary terminal *d* and its cathode connected to the auxiliary terminal *c* through the resistance R. Referring to FIG. 1, for example, the first thyristor $T_1$ of large capacity corresponds to the thyristor in which the emitter and the gate or triggering means are the N-type emitter layer $N_E$ and the annular metal strip 6 extending substantially along the entire periphery of the N-type emitter layer $N_E$, respectively. The second thyristor $T_2$ of small capacity corresponds to the thyristor in which the emitter and the gate are the projecting region 5 and the gate 4 of very small area disposed opposite to the projecting region 5, respectively. The resistance R corresponds to the lateral resistance of the projecting region 5 encountered by the current flowing from the gate 4 toward the N-type emitter layer $N_E$.

The turn-on process of this equivalent circuit will now be discussed. A voltage is applied across the main terminals *a* and *b* so that the main terminal *b* is positive with respect to the main terminal *a*, and then a gate voltage is applied across the auxiliary terminals *c* and *d*. In response to the application of the gate voltage, gate current flows across the gate and the cathode of these thyristors and the second thyristor $T_2$ of small capacity is initially turned on. The first thyristor $T_1$ of large capacity is not turned on yet since a large gate current is required for turning on the same. As a result of the turn-on of the second thyristor $T_2$ of small capacity, load current flows through the circuit leading from the main terminal *b* to the main terminal *a* through the second thyristor $T_2$, and due to the voltage drop across the resistance R, a potential difference appears between the gate of the second thyristor $T_2$ and the gate of the first thyristor $T_1$. Due to the appearance of the potential difference, holes accumulating in excess in the P-type base layer $P_B$ of the second thyristor $T_2$ of small capacity are transferred from the gate toward the gate of the first thyristor $T_1$ of large capacity, with the result that the so-called base current flows into the gate of the first thyristor $T_1$ of large capacity to act as gate current thereby turning on the emitter. The base current takes various values depending on the value of the resistance R. This resistance R may be selected to lie within the range of 0.5 to 30 ohms so that the base current may be five to ten times as large as the gate current for the second thyristor $T_2$ of small capacity. By selecting the base current to lie within this range, the first thyristor $T_1$ of large capacity can be sufficiently turned on over a wide region. It will be apparent from the equivalent circuit shown in FIG. 7 that the technical idea of the present invention includes the combination of separate thyristors of large and small capacity respectively so as to utilize the base current produced due to the turn-on of the thyristor of small capacity for turning on the thyristor of large capacity.

While the foregoing description has referred by way of example to the thyristor device in which the projecting region 5, gate 4 and annular metal strip 6 are disposed on the side of the N-type emitter layer $N_E$, the projecting region, gate and annular metal strip may be disposed on the side of the P-type emitter layer $P_E$. In this case, electrons which are majority carriers of the N-type base layer $N_B$ produce the base current which is supplied from the intermediate layer to the periphery of the P-type emitter layer $P_E$ through the annular metal strip.

The present invention will be explained by taking practical numerical values of the portions constituting the thyristor device of the structure shown in FIG. 3 by way of example. Suppose that the outer diameter of the N-type emitter layer $N_E$ is about 30 mm, the neck portion 51 of the projecting region 5 is 0.7 mm wide and 1.5 mm long, the head portion 52 of the projecting region 5 is 3.5 mm wide and 1.5 mm long, the annular metal strip 6 is 1 mm wide and 100 mm long, and the annular metal strip 6 is spaced from the N-type emitter layer $N_E$ and the neck portion 51 of the projecting region 5 by 0.25 mm. The thyristor device having such dimensions could satisfactorily operate with an inrush current slope *di/dt* of 1500 A/$\mu$s and was free from mal-operation even with a voltage build-up rate of 500 to 1000 V/$\mu$s when it was turned on from a 1200-volt forward blocking condition. A test was conducted on the prior art thyristor of the structure in which the thickness of the end layer is reduced at the portion between one of the main electrodes and the gate. When, in such prior art thyristor, the portion of the end layer having a reduced thickness was widened so that it could withstand an inrush current slope *di/dt* of the order of 1500 A/$\mu$s, mal-operation occurred with a voltage rate *dV/dt* of the order of 100 V/$\mu$s, that is, the thyristor was prematurely turned on before gate current was supplied.

I claim:

1. A thyristor device comprising a first layer of one conductivity type, a second and a third layer of the other conductivity type formed on opposite sides of said first layer in contiguous relation to said first layer, a fourth layer of the same conductivity type as said first layer, said fourth layer being embedded in said third layer with its surface exposed to the outside, a first and a second electrode disposed on said second and fourth layers respectively, and a third electrode disposed on said third layer, wherein a portion of said fourth layer opposite to said third electrode is extended toward said third electrode to form a projecting region of narrow width having the same conductivity type as said fourth layer, and a metal strip is disposed only on said third layer so that said metal strip is opposite to said projecting region at least at one end portion thereof and extends substantially along the periphery edge of said fourth layer.

2. A thyristor device as claimed in claim 1, in which said projecting region consists of a neck portion lying opposite to said end portion of said metal strip and a head portion extending from said neck portion toward said third electrode beyond said end portion of said metal strip and being so sized that the width thereof along the portion of said metal strip opposite thereto is larger than that of said neck portion.

3. A thyristor device as claimed in claim 2, in which the surface of said head portion of said-projecting region is covered with a conductive layer of the substantially same shape as said head portion.

4. A thyristor device as claimed in claim 2, in which said metal strip and said head portion of said projecting region are shaped in the form of a comb at portions opposite to each other so that the comb-like teeth thereof mesh with each other substantially.

5. A thyristor device as claimed in claim 4, in which the surface of said head portion of said projecting region is covered with a conductive layer of substantially the same shape as said head portion.

6. A thyristor device as claimed in claim 1, in which the peripheral edge of said fourth layer and said metal strip are shaped in the form of a comb at portions opposite to each other so that the comb-like teeth thereof mesh with each other substantially.

7. A thyristor device as claimed in claim 2, in which the peripheral edge of said fourth layer and said metal strip are shaped in the form of a comb at portions opposite to each other so that the comb-like teeth thereof mesh with each other substantially.

8. A thyristor device as claimed in claim 3, in which the peripheral edge of said fourth layer and said metal strip are shaped in the form of a comb at portions opposite to each other so that the comb-like teeth thereof mesh with each other substantially.

9. A thyristor device as claimed in claim 1, in which said metal strip is substantially annular in shape.

10. A thyristor device as claimed in claim 2, in which said metal strip is substantially annular in shape.

11. A thyristor device as claimed in claim 3, in which said metal strip is substantially annular in shape.

12. A thyristor device comprising a first layer of one conductivity type, a second and a third layer of the other conductivity type formed on opposite sides of said first layer in contiguous relation to said first layer, a fourth layer of the same conductivity type as said first layer, said fourth layer being embedded in said third layer with its surface exposed to the outside, a first and a second electrode disposed on said second and fourth layers respectively, and a third electrode disposed on said third layer, wherein a fifth layer of small area having the same conductivity type as said fourth layer is embedded in said third layer at a suitable position between said fourth layer and said third electrode and has its surface exposed to the outside, and a metal strip is disposed only on said third layer so that it passes through the space between said fourth and fifth layers and extends along the peripheral edge of said fourth layer, said fourth layer being connected electrically to said fifth layer by an external impedance.

13. A thyristor device as claimed in claim 12, in which said metal strip and the peripheral edge of said fourth layer are shaped in the form of a comb at portions opposite to each other so that the comb-like teeth thereof mesh with each other substantially.

14. A thyristor device as claimed in claim 12, in which said external impedance is an inductive impedance.

15. A switching device comprising:

first and second thyristors, said first thyristor having a PNPN structure consisting of a first layer of a first conductivity type, a second and a third layer, of a second conductivity type opposite to said first conductivity type, formed on opposite sides of said first layer and forming first and second PN junctions therewith, a fourth layer of said first conductivity type, said fourth layer being embedded in and forming a third PN junction with said third layer with one surface thereof extending to the surface of said third layer opposite said second PN junction, a first and a second electrode disposed on said second and fourth layers respectively, and a third electrode disposed on said third layer, and said second thyristor having a PNPN structure consisting of a fifth layer of said first conductivity type, a sixth and a seventh layer of said second conductivity type, formed on opposite sides of said fifth layer and forming fourth and fifth PN junctions therewith, an eighth layer of said first conductivity type, said eighth layer being embedded in and forming a sixth PN junction with said seventh layer, with one surface thereof extending to the surface of said layer opposite to said fifth PN junction, a fourth and a fifth electrode disposed on said sixth and eighth layers respectively, and a sixth electrode disposed only on said seventh layer, and wherein said first and fifth layers, said second and sixth layers, said third and seventh layers and said fourth and eighth layers are contiguous to one another respectively, so that said first and fourth PN junctions, said second and fifth PN junctions and said third and sixth PN junctions are respectively contiguous, and wherein said first and fourth electrodes and said second and fifth electrodes are respectively electrically connected together, and further including an impedance region coupled between the portion of said seventh layer on which said sixth electrode is disposed and the portion of said fourth layer on which said second electrode is disposed providing and impedance therebetween.

* * * * *